United States Patent [19]

Bell et al.

[11] Patent Number: 5,121,292

[45] Date of Patent: Jun. 9, 1992

[54] FIELD REPLACEABLE CRYOCOOLED COMPUTER LOGIC UNIT

[75] Inventors: David F. Bell, Woodstock; Raymond D. Birchall, Ruby; Harry A. Carlson, High Falls; Willard S. Harris, Red Hook; Edward J. Ossolinski, Poughkeepsie; Vincent C. Vasile, Marlboro; James R. Warnot, Jr., Rhinebeck, all of N.Y.

[73] Assignee: International Business Machines Corporation, Armonk, N.Y.

[21] Appl. No.: 468,529

[22] Filed: Jan. 23, 1990

[51] Int. Cl.⁵ .............................................. H05K 7/20
[52] U.S. Cl. .................. 361/385; 174/15.4; 361/381
[58] Field of Search .................. 165/80.4, 104.33; 174/15.1, 15.4, 16.1; 357/82, 83; 361/381, 382, 385, 386, 388, 389

[56] References Cited

U.S. PATENT DOCUMENTS

| | | | |
|---|---|---|---|
| 3,412,320 | 11/1968 | Marshall | 174/15.4 |
| 3,812,402 | 5/1974 | Garth | 361/385 |
| 4,502,296 | 3/1985 | Ogata et al. | 174/15.4 |
| 4,907,124 | 3/1990 | Kaufman | 361/387 |
| 4,980,754 | 12/1990 | Kotani et al. | 174/15.4 |

*Primary Examiner*—Gregory D. Thompson
*Attorney, Agent, or Firm*—Mark S. Walker; William A. Kinnaman

[57] ABSTRACT

A cryocooled field-replaceable logic unit for use with a cryogenic cold head such as that of a cryocooler comprises a thermally conductive plate adapted to be disposed in thermal contact with the cold head, a thermally insulating enclosure portion cooperating with the conductive plate to form a sealed enclosure detachable from the cold head, and one or logic chips mounted in the enclosure in thermal contact with the conductive plate. Preferably the conductive plate is attached to the thermally insulating portion through a resilient mounting which forms a recess for receiving the cold head and which is tension-loaded when the logic unit is mounted on the cold head to urge the plate into intimate thermal contact with the cold head. In one embodiment the enclosure receives from an external source a supply of gaseous nitrogen which is liquified by contact with the conductive plate to form a pool of liquid nitrogen in which the logic chips are immersed. In another embodiment plural logic units are detachably mounted on passive cold heads immersed in a cryostat.

19 Claims, 6 Drawing Sheets

FIELD REPLACEABLE CRYOCOOLED COMPUTER LOGIC UNIT

BACKGROUND OF THE INVENTION

1. Field of the Invention

This invention relates to a cryocooled logic unit for use with a cryocooler cold head and more particularly to a cryocooled logic unit of a digital computer.

2. Description of the Related Art

Cryocooled computers, in which certain logic components are cryogenically cooled to increase their speed of operation, are well known in the art. In a cryocooled computer, the logic components may be cooled by being in direct contact with the cryocooler cold head and insulated from the external environment, preferably by a vacuum vessel. To accommodate a logic or cryocooler failure, the vacuum vessel would have to be made so that it can be taken apart to separate the logic components from the cryocooler. This would be time consuming, since the cold head would have to be given time to come to room temperature before the service person could take the vacuum vessel apart to remove the logic components. The vacuum vessel would then have to be reassembled and a vacuum pump would have to be employed to recreate the vacuum in the space around the cold head. Even with all this, there would be no easy way for the service person to check for leaks.

SUMMARY OF THE INVENTION

In general, the present invention contemplates a cryocooled logic unit for use with a cryocooler cold head comprising a thermally conductive enclosure portion adapted to be disposed in thermal contact with the cold head, a thermally insulated enclosure portion cooperating with the conductive portion to form an enclosure detachable from the cold head, and a semiconductor logic circuit mounted in the enclosure in thermal contact with the conductive portion. Preferably, the enclosure is formed with a recess, preferably a cylindrical recess, for receiving the cold head. Preferably, the enclosure comprises a vacuum vessel, while the thermally insulating portion comprises either a lining of insulating material or an outer wall and an inner wall defining a region which is also evacuated. Preferably, means are provided for urging the conductive portion of the enclosure into engagement with the cold head.

With this invention, the logic components can be assembled and tested in the vacuum vessel at the factory as a field-replaceable unit (FRU). If the logic fails, the vacuum vessel unit can be quickly removed and can be replaced by a spare, and the failing unit sent back to the factory for repair. The same is true for a cryocooler failure. If the latter failure occurs, the vacuum vessel unit can be easily removed and reassembled onto a new cryocooler.

DESCRIPTION OF THE PREFERRED EMBODIMENTS

Figure 1:
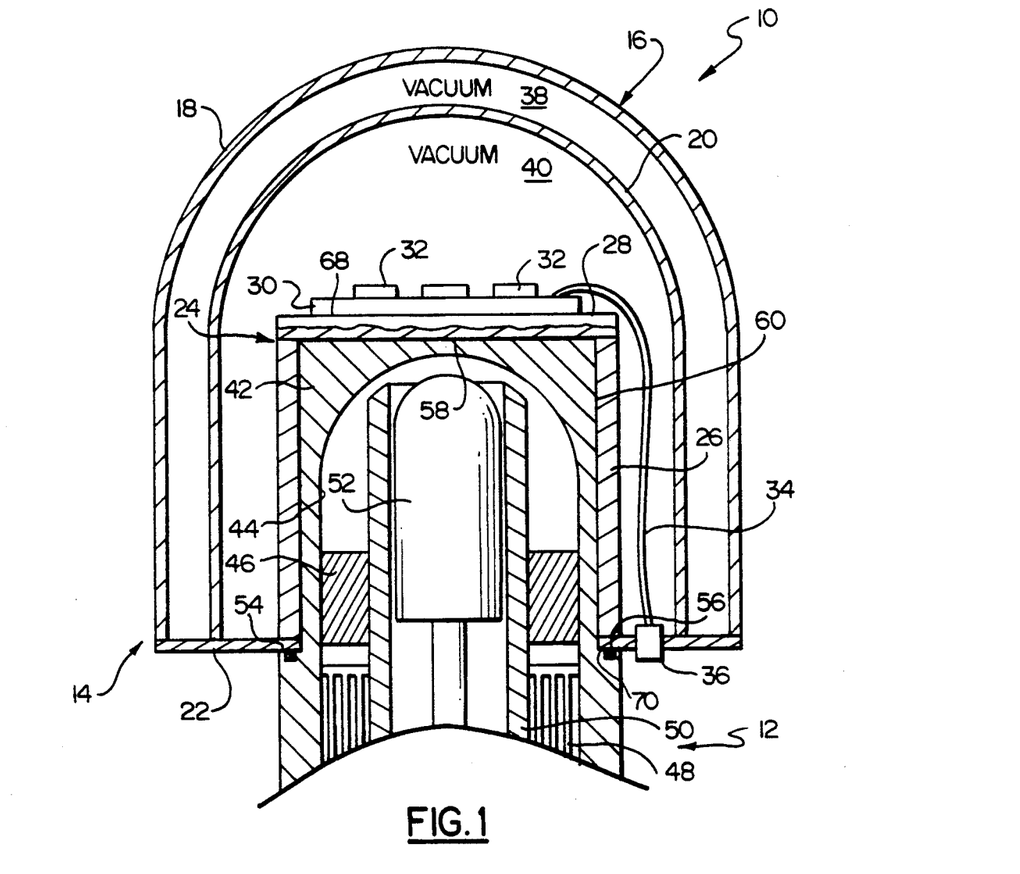
FIG. 1 is a fragmentary section illustrating one embodiment of the present invention.

Referring first to FIG. 1, a system 10 incorporating the present invention includes a cryocooler field-replaceable unit (FRU) 12 and a logic FRU 14. Logic unit 14, which is detachable from the cryocooler unit 12, comprises a generally dome-shaped vacuum vessel 16, the thermally insulating portion of which comprises an outer wall 18 and an inner wall 20. Walls 18 and 20 are joined by any suitable means to an annular bottom wall 22. Bottom wall 22 supports a cylindrical recess-forming portion 24 comprising a side wall 26 and an upper wall comprising a thermally conductive plate 28. Conductive plate 28 of recess 24 supports a chip carrier 30, which in turn supports one or more computer logic chips 32, each of which comprises a semiconductor integrated circuit. Typically the semiconductor material may be CMOS or gallium arsenide, while the circuits may comprise either computer processors or computer memories, especially cache memories associated with processors. Preferably, chip carrier 30 comprises a material, such as silicon or ceramic, having a coefficient of expansion approximating that of chips 32. Electrical cables 34 extending between chips 32 and one or more cable connectors 36 carried by bottom wall 22 provide an electrical connection between chips 32 and the external environment. Preferably, both the exterior region 38 between outer and inner walls 18 and 20 and the interior region 40 within inner wall 20 are evacuated. At a minimum, however, there should be at least one vacuum barrier insulating the logic chips 32 from the ambient environment.

Conductive plate 28 preferably comprises a highly thermally conductive material such as copper. The remaining walls 18, 20, 22 and 26 of vacuum vessel 16 may comprise a suitable structural material such as stainless steel.

Cryocooler unit 12 comprises a generally cylindrical cryocooler cold head 42, the upper or expander portion of which fits within the recess 24 of logic unit 14. Cryocooler cold head 42 is formed with a bore 44 within which is disposed an annular regenerator 46 and an annular cooler 48 beneath regenerator 46. A cylindrical sleeve 50 disposed inside of regenerator 46 and cooler 48 in turn houses a reciprocating displacer 52. The upper portion of cryocooler cold head 42 is formed with a reduced diameter to define a shoulder 54 which abuts bottom wall 22 of logic unit 14 when the upper surface of cryocooler cold head 42 is pressed against the conduction plate 28 of logic unit 14. Except for the attachment modifications to be discussed below, cryocooler unit 12 is a conventional unit of a type well known in the art. As is known in the art, a temperature gradient exists along the surface of cryocooler cold head 42, with the uppermost portion adjacent conduction plate 28 the coldest and the lower portion adjacent shoulder 54 substantially at room temperature.

The interface 58 between the upper portion of the cryocooler cold head 42 and the conduction plate 28 of logic unit 14 represents the thermal gap between the cryocooler unit 12 and the vacuum vessel 16 that is part of the logic unit. The vacuum vessel 16 insulates the cryocooler cold head 42 thermally from the ambient air. The thermal resistance at interface 58 should be kept as low as possible. The particular method used to attach the vacuum vessel 16 to the cryocooler cold head 42 will have a great effect on the thermal resistance at interface 58. There are several ways of attaching the vacuum vessel 16 to the cryocooler cold head 42. Thus, some or all of the interface 60 between cryocooler cold head 42 and side wall 26 of recess 24 can be threaded and the two parts can be screwed together. Alternatively, studs, like the one shown at 62 in FIG. 2, protruding from the bottom wall 22 of the vacuum vessel 16 could fit into holes in a flange 64 extending around the expander portion of cryocooler cold head 42 in the area of the cooler 48. Nut 66 such as on the stud 62 could then be used to bring the parts together tightly. As a further alternative, the bottom wall 22 of the vacuum vessel 16 could have a quick-disconnect, twist-on ramp fastening mechanism (not shown) that would meet with the cryocooler cold head 42 in the area of the cooler 48. This mechanism would be similar to a pressure cooker lid. Still other methods may alternatively be used to attach the two parts. Additionally, or alternatively, interface 58 may contain certain thermal conductivity enhancers such as copper wire mesh, copper "fingers", corrugated copper foil or the like.

Interface 68 between the chip carrier 30 and the conduction plate 28 of recess 24 represents another thermal gap whose resistance must be minimized. Any one of several methods that will minimize the thermal resistance may be used to attach the chip carrier 30 to the conduction plate 28. Thus, the chip carrier 30 may be attached directly to the conduction plate 28 using screws threaded into the vacuum vessel 16 and going through clearance holes in the chip carrier 30. Alternatively, the chip carrier 30 may be held against the conduction plate 28 by a system of clamps. As a further alternative, the chip carrier 30 may be soldered, brazed or glued directly to the plate 28. Still other methods may be used to attach the chip carrier 30 to the vacuum vessel 16.

Interface 70 between bottom wall 22 of vacuum vessel 16 and shoulder 54 of cryocooler cold head 42 should contain a seal, such as the O-ring seal 56 shown in FIG. 1, to prevent room air from circulating in the small space between the expander portion of the cryocooler cold head 42 and the vacuum vessel 16. If air circulation is allowed in this space, water may condense and freeze above the regenerator 46, and air may condense and liquify further up on the cryocooler cold head 42.

The region 40 above the logic components 32 and the vacuum vessel 16 also cannot contain room air, since such air contains moisture that will condense and freeze on walls 26 and 28, chip carrier 30 and the logic component 32, since the cryocooler cold head 42 operates at a temperature that will liquify nitrogen. Evacuating the region 40 prevents this from happening and, as noted above, thermally insulates the thermally conductive portion of the vessel 16 comprising cold plate 28 from walls 18 and 20 and the ambient atmosphere.

Figure 2:
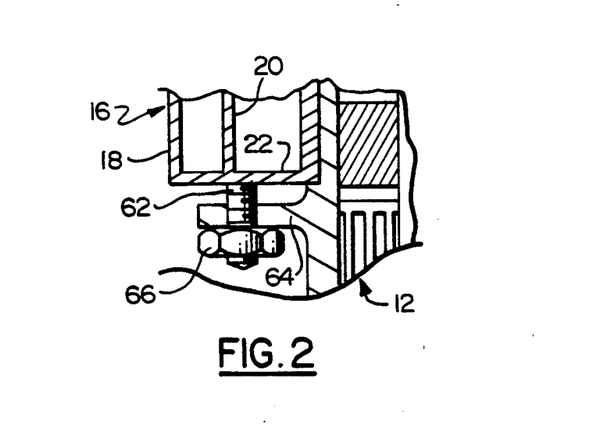
FIG. 2 is an enlarged fragmentary section illustrating a modification of the apparatus shown in FIG. 1.
Figure 3:
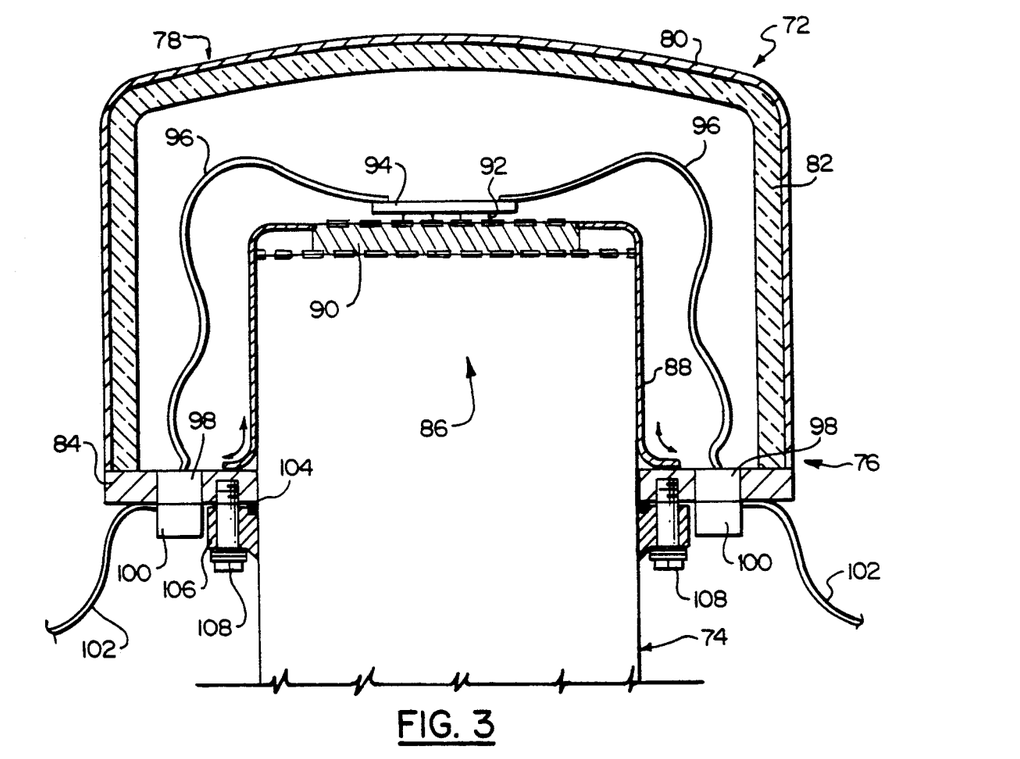
FIG. 3 is a fragmentary section illustrating a further modification of the embodiment shown in FIG. 1.

FIG. 3 shows a modified logic unit in which the rigid side wall 26 of FIGS. 1 and 2 has been replaced by a compliant spring member to improve the reliability of contact between the conduction plate and the cryocooler cold head of the cryocooler unit. More particularly, the cryocooler assembly 72 shown in FIG. 3 comprises a cryocooler FRU 74 and a detachable logic FRU 76. Logic unit 76 comprises a vacuum vessel 78 having an outer wall 80 comprising a suitable structural material such as stainless steel. Outer wall 80 has its inner surface lined with one or more layers of suitable insulating material 82 such as aluminized Mylar (trademark) polyester. Outer wall 80 is joined by any suitable means to a bottom wall 84, which may also comprise stainless steel. The cold head of cryocooler unit 74 is adapted to be inserted through a center aperture formed in bottom wall 84, into an upwardly extending recess defined by a conduction plate 90 at the upper end of the plate 90 to bottom wall 84. As in the previous embodiment, conduction plate 90 may comprise a suitable highly thermally conductive material such as copper, while compliant member 88 may comprise a relatively thin sheet of stainless steel. Conduction plate 90 supports a logic carrier 92, which may be similar to carrier 30 and which supports the cryocooled logic 94. Respective cables 96 couple logic 94 electrically to connectors 98 carried by bottom wall 84, which connectors 98 are in turn attachable to external connectors 100 carried at the ends of external cables 102. Bolts 108 extending upwardly through a flange 106 carried by cryocooler unit 74 into threaded bores formed on the underside of bottom wall 84 detachably secure logic unit 76 to cryocooler unit 74. A resilient O-ring seal 104 of any suitable material extending around cryocooler unit 74 between flange 106 and bottom wall 84 of unit 76 prevents air from entering the region between compliant member 88 and cryocooler unit 74.

Compliant member 88 is loaded in tension by the attachment of logic unit 76 to cryocooler unit 74. This load condition creates a deflection which is sufficient to compensate for such imperfections as non-parallel mating between the conduction plate 90 and the adjacent surfaces of cryocooler unit 74 and differential thermal expansion and contraction in the assembly 72 over the large temperature excursions experienced. The loading of compliant member 88 upon attachment of logic unit 76 to cryocooler unit 74 lowers the thermal resistance at the interface between conduction plate 90 and the cold head of cryocooler unit 74 by allowing the conduction plate to align itself to a range of cryocooler cold head surface tilt angles and by maintaining contact pressure along that interface as the materials contract when brought down to cryogenic temperatures. This allows the logic unit 76 to be installed on the cryocooler unit 74 while the parts are at room temperature without the need for retorquing the bolts 108 (or other attachment means) when the parts are at low temperature. This makes field replacement faster and easier. Also, the ability of the conduction plate 90 to conform to a variety of cold head tilt angles provides relief on tolerances required to govern the mating surface angles.

Compliant member 88 is designed to minimize the thermal conductance in an axial direction by keeping its cross sectional area small and its axial dimension relatively large, while not exceeding the material elastic limits when it is loaded in tension. As noted above, the circulation of ambient air is precluded by seal 104, which becomes compressed between the flange 106 and bottom wall 84 when the assembly 72 is bolted together. The seal compression is maintained by the ability of the compliant member 88 to maintain preload on the bolts 108 over the temperature excursions experienced. Seal 104, being compliant, also provides relief on the tolerances for the mating parts on flange 106 and bottom wall 84. Preferably, assembly 72 includes 8 bolts 108, which are torqued to a standard torque that provides the required loading at the interface between conduction plate 90 and cryocooler unit 74. Other mounting methods such as those pointed out in conjunction with the embodiment shown in FIG. 1 may also be used.

Figure 4:
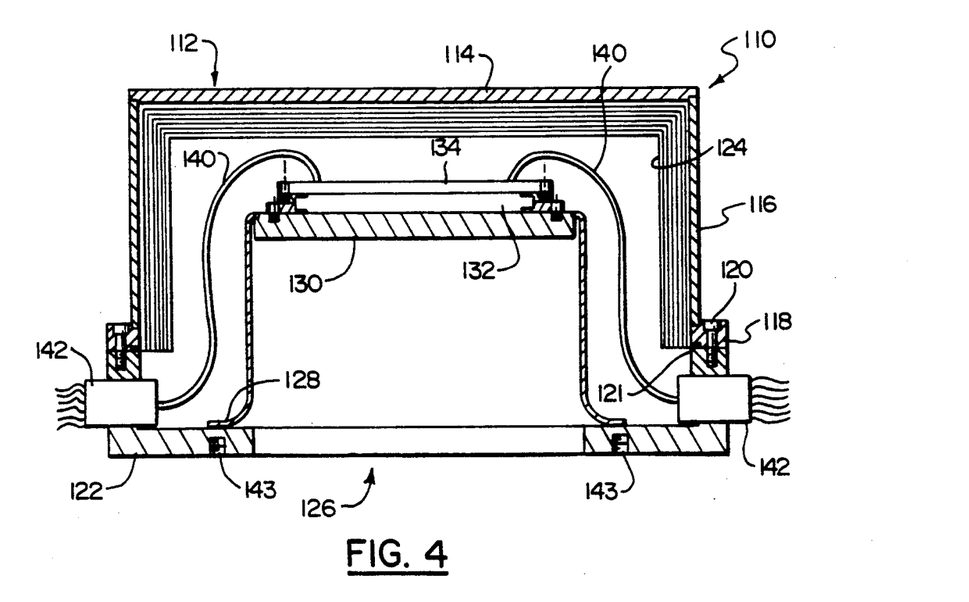
FIG. 4 is a fragmentary section illustrating still another modification of the embodiment shown in FIG. 1.

FIG. 4 shows a variant of the embodiment shown in FIG. 3 in which the cable connectors extend out the side of the logic unit rather than through the bottom as in FIGS. 1 through 3. More particularly, a logic unit 110 shown in FIG. 4 comprises a vacuum vessel 112 having an upper wall 114 and a cylindrical side wall 116 joined together by any suitable means. An outwardly extending flange 118 carried at the bottom of wall 116 is formed with bores at spaced locations about its periphery for receiving bolts 120 for attaching the upper portion of unit 110, comprising flange 118 and the associated wall portions 114 and 116, to a lower portion 122 having both a side wall and an apertured lower wall thereof. Walls 114 and 116 are lined along their inner surfaces by one or more insulating layers 124 similar to the layers 82 shown in FIG. 3. A cryocooler unit such as the unit 74 shown in FIG. 3 is attached to logic unit 110 by inserting it upwardly through the aperture in lower portion 122 into a recess 126 defined by a compliant member 128 similar to member 88 of FIG. 3 and a conduction plate 130 similar to plate 90 of FIG. 3.

Figure 4A:
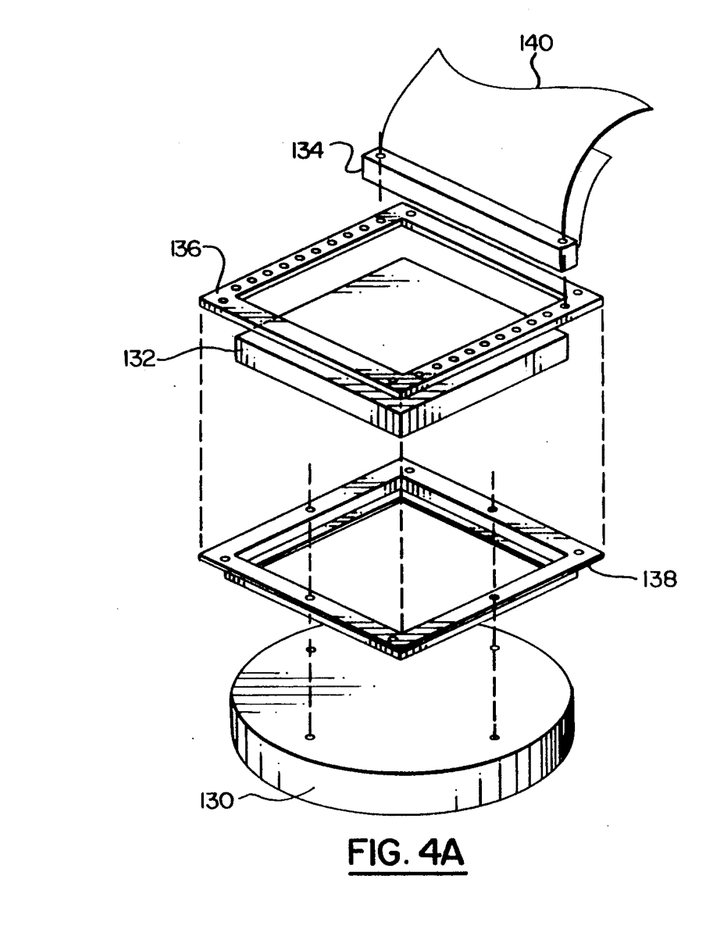
FIG. 4A is an exploded view of the conduction plate and associated components of the embodiment shown in FIG. 4.

Conduction plate 130 supports a logic module 132, which may be CMOS or gallium arsenide, as disclosed above, or other cryogenically enhanced technology. Respective cables 140, secured to logic module 132 through a cable retainer 134, couple module 132 electrically to connectors 142 carried by the side wall portion of lower vacuum vessel portion 122. As shown in FIG. 4A, module 132 fits inside of a mounting frame 138 secured to conduction plate 130. Module 132 is sandwiched between plate 130 and a clamp frame 136 secured to mounting frame 138 over the module. Clamp frame 136 also supports cable retainer 134.

Connectors 142 form a hermetic seal with wall portions 122. Logic unit 110 is secured to cryocooler unit 74, in a manner similar to that of logic unit 76 shown in FIG. 3, with bolts 108 being inserted into apertures 143. Owing to the location of the connectors 142 on the side of the vacuum vessel 112, there is less interference between the electrical couplings through connector 142 and the mechanical coupling to the flange 106 and bolts 108 of the cryocooler unit 74.

Flange 118 and wall portions 114 and 116 supported by the flange may be separated from lower vacuum vessel portion 122 after removing bolts 120 to access logic module 132 for servicing or replacement. Preferably an O-ring seal 121 is disposed along the interface between flange 118 and portion 122 to ensure the integrity of the enclosure.

Figure 5:
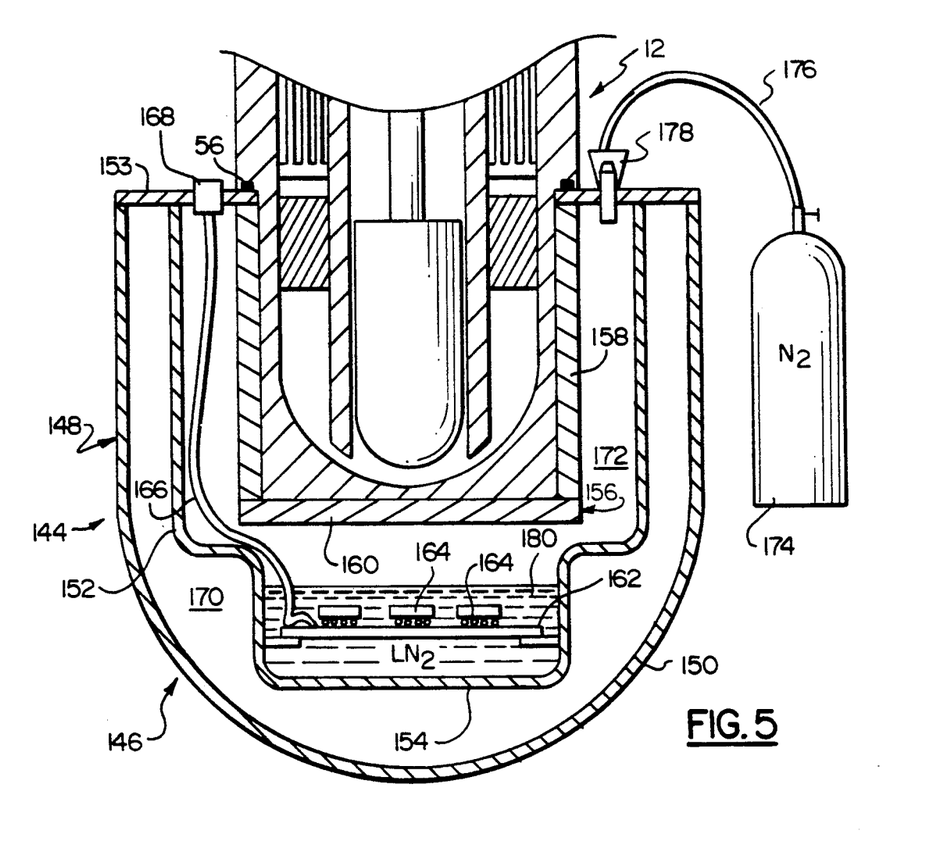
FIG. 5 is a fragmentary section of an embodiment of our invention in which the vacuum vessel unit contains a pool of liquid nitrogen in which the logic is immersed.

FIG. 5 shows a modified assembly in which the logic unit is inverted in order to provide for the immersion of the logic chips in a cryogenic pool confined to the logic unit. More particularly, the assembly 144 shown in FIG. 5 comprises the cryocooler unit 12 of FIG. 1 and a logic unit 146 detachably mounted thereon. Logic unit 146 comprises a vacuum 148 having an outer wall 150 similar to outer wall 18 of unit 14 and an inner wall 152 similar to inner wall 20 of unit 14, but provided with a recess or well 154 for accommodating a self-contained supply of cryogenic liquid. Vacuum vessel 148 also has, in a manner similar to that of vacuum vessel 16 of FIG. 1, a recess forming portion 156 for receiving cryocooler unit 12, the recess forming portion 156 being formed from a cylindrical side wall 158 and a highly thermally conductive conduction plate 160. A chip carrier 162 mounted within well 154 supports the logic chips 164 to be cryogenically cooled. Cables 166 couple chips 164 electrically to connectors 168 carried by upper wall 153. The exterior region 170 between walls 152 and 150 is preferably evacuated, while the interior region 172 receives a liquifiable gas such as nitrogen from a supply 174 by way of a hose 176 and connector 178 carried by upper wall 153.

Conduction plate 160 is ground flat and smooth to make good thermal contact with the cold head of cryocooler unit 12, which is also ground flat and smooth. The attachment mechanism for the logic unit 146 (not shown in FIG. 5), which may be similar to those shown in FIGS. 2 and 3, will press these two surfaces tightly together when the unit 146 is attached to the cryocooler unit 12. As in the embodiment shown in FIG. 1, a suitable thermal conduction enhancer may be used to fill in any imperfections of the surfaces; such enhancers include, for example, a soft thin metal foil, thermal grease, a resilient matted conduction material, and the like. Further, wall 158 may be replaced by a thin, relatively compliant member as in the embodiments shown in FIGS. 3 and 4.

The temperature rise across the thickness of conduction plate 160 will be low. This being the case, the temperature on the inside surface of this plate (the lower surface in FIG. 5) can be brought to 77° K. or slightly lower with the use of a sufficiently cold cryocooler unit 12. At this temperature, nitrogen from the supply 174 will condense on the plate 160 or on fins (not shown in FIG. 5) protruding from the plate. The liquid nitrogen thus formed will drip into the well 154 to immerse the logic chips 164 in a pool 180. The logic chips 164 will now operate at slightly above 77° K.

Logic unit 146 is preferably charged with nitrogen gas when it is built. When it is mounted on the cryocooler 12, hose 176 from supply 174 is attached to the unit 146. The cryocooler unit 12 is then turned on to start the liquification of the nitrogen gas within the logic unit 146. As the nitrogen within the logic unit 146 is liquified, the pressure within the unit drops, drawing in more nitrogen gas from the supply 174. This continues until the logic chips are immersed in a liquid nitrogen pool 180 as shown in FIG. 5. Power is then brought up on the logic circuits and processing begins.

Logic unit 146 preferably includes a relief valve (not shown) to allow nitrogen gas to escape when pressure inside the unit increases. This will happen when power is turned off or there is a logic failure which requires the unit to be changed. The pressure will increase as the liquid nitrogen becomes nitrogen gas.

Figure 6:
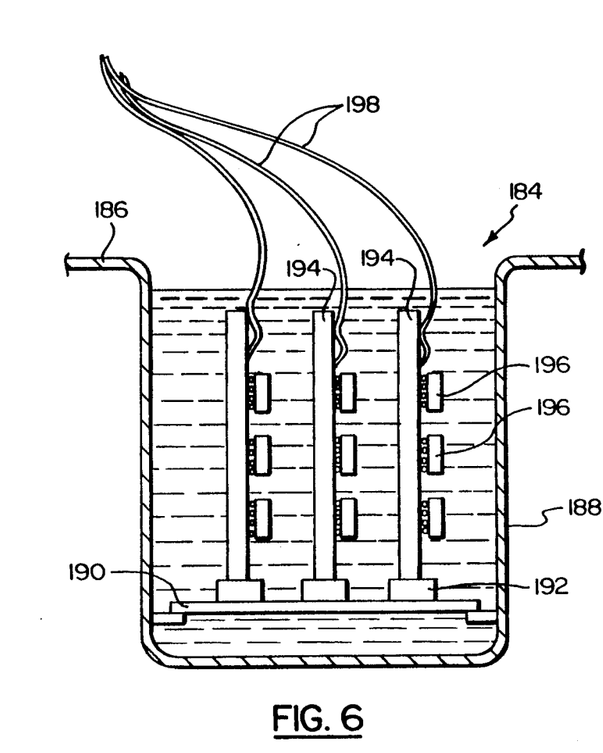
FIG. 6 is a fragmentary section illustrating a modification of the embodiment shown in FIG. 5 for permitting a larger number of chips to be immersed in the liquid nitrogen.

If more logic is required, the well can be made larger and various arrangements of packages can be immersed. Thus, referring now to FIG. 6, a logic unit 184 otherwise similar to logic unit 146 of FIG. 5 includes a modified inner wall 186 formed with an enlarged well 188 near the bottom of which is disposed a card 190. Respective chip carriers 194 plug into respective connectors 192 carried by card 190 so as to stand vertically in the liquid nitrogen pool as shown in FIG. 6. Connectors 192 support chip carriers 194 mechanically as well as providing electrical connections therebetween. Each chip carrier 194 carries one or preferably a plurality of logic chips 196. Respective cables 198 provide an electrical connection between chip carriers 194 and the external environment.

Figure 7:
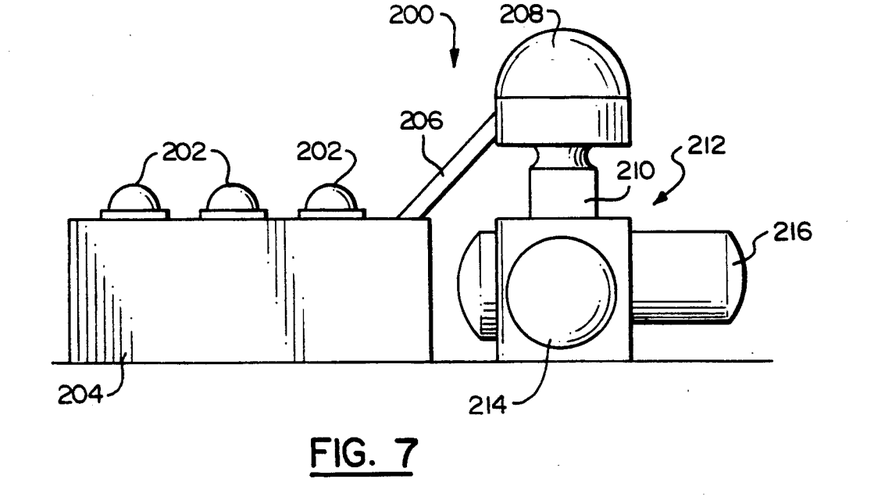
FIG. 7 is an elevation illustrating an alternative embodiment in which a single cryocooler cold head is used to cool a plurality of logic units.
Figure 8:
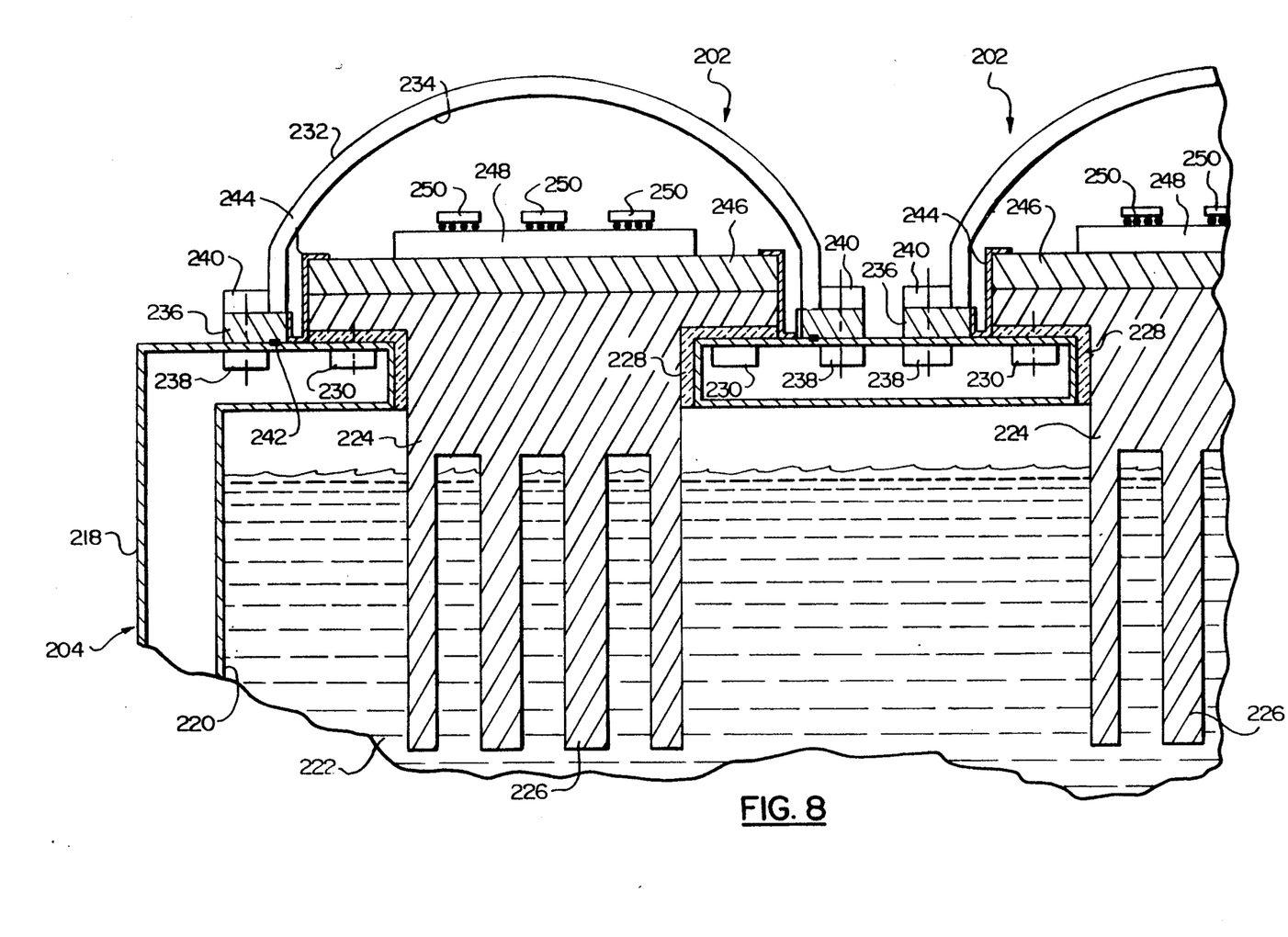
FIG. 8 is a fragmentary enlarged section of a portion of the apparatus shown in FIG. 7.

FIG. 7 shows an alternative embodiment of the present invention in which a plurality of logic units may be detachably secured to respective cold heads immersed in a cryostat. More particularly, the system 200 shown in FIG. 7 comprises a plurality of field-replaceable logic units 202 which are detachably secured onto the cold heads (not shown in FIG. 7) of a cryostat 204. Since cryostats are well known in the art, the structure and operation of the cryostat 204 will not be described in detail except for the modifications that are specific to its use in conjunction with logic units 202. A cryogenically insulated duct 206 connects cryostat 204 to the similarly cryogenically insulated cold head 208 of a cryogenic cooler 212 having an expander portion 210 and a compressor 214 driven by a motor 216. Like cryostat 204, cryocooler 212 is of a type well known in the art, and will hence not be described in detail herein. Referring now to FIG. 8, cryostat 204 includes an outer wall 218 and an inner wall 220 formed of any suitable material, such as stainless steel. Preferably, the region between outer and inner walls 218 and 220 is evacuated to minimize heat transfer through the cryostat wall. Cryostat 204 contains a pool 222 of cryogenic liquid such as liquid air or, preferably, liquid nitrogen which is cooled by cryogenic cooler 212. Respective cryostat cold heads 224 mounted in apertures formed on the upper surface of cryostat 204 have fins 226 (either straight fins or pin fins) extending downwardly into pool 222 to maintain the upper portions of heads 224 at a cryogenic temperature. Preferably, a thermally insulating seal 228 is used to seat each cryostat cold head 224 relative to the upper wall of cryostat 204. Respective blocks 230 carried on the underside of outer wall 218 beneath each cryostat cold head 224 are threaded through a portion of their thickness to receive mounting bolts (not shown) countersunk beneath the upper surface of the cryostat cold head 224.

Each logic unit 202 has a dome-shaped upper portion comprising an outer wall 232 and an inner wall 234, the region between which is preferably evacuated to minimize heat transfer. Alternatively, inner wall 234 may be replaced with a layer of insulating material as in FIGS. 3 and 4. The lower rim portions of walls 232 and 234 are joined to an outwardly extending solid base or flange 236 which mates with the outer wall 218 of the cryostat 204. Blocks 238 similar to blocks 230 carried on the underside of outer wall 218 are threaded through a portion of their thickness to receive mounting bolts 240 extending through apertures formed in flange 236, thereby to detachably secure each logic unit 202 to the cryostat 204 above a cryostat cold head 224. Preferably, at least one O-ring seal 242 is disposed along the circumferential interface between flange 236 and outer wall 218 to minimize heat transfer by convection along the interface as well as to exclude ambient air. A resilient annular member 244 secured to the inner surface of each flange 236 extends upwardly to receive a conduction plate 246 comprising a highly thermally conductive material such as copper. As in the embodiment shown in FIG. 3, resilient member 244 is tension loaded when logic unit 202 is secured onto cryostat cold head 224, thereby urging the lower surface of plate 246 into intimate thermal contact with the upper surface of cryostat cold head 224. In a manner similar to the embodiment described above, conduction plate 246 supports a chip carrier 248 comprising a suitable thermally conductive material. Chip carrier 248 in turn supports one or more logic chips 250.

Figure 9:
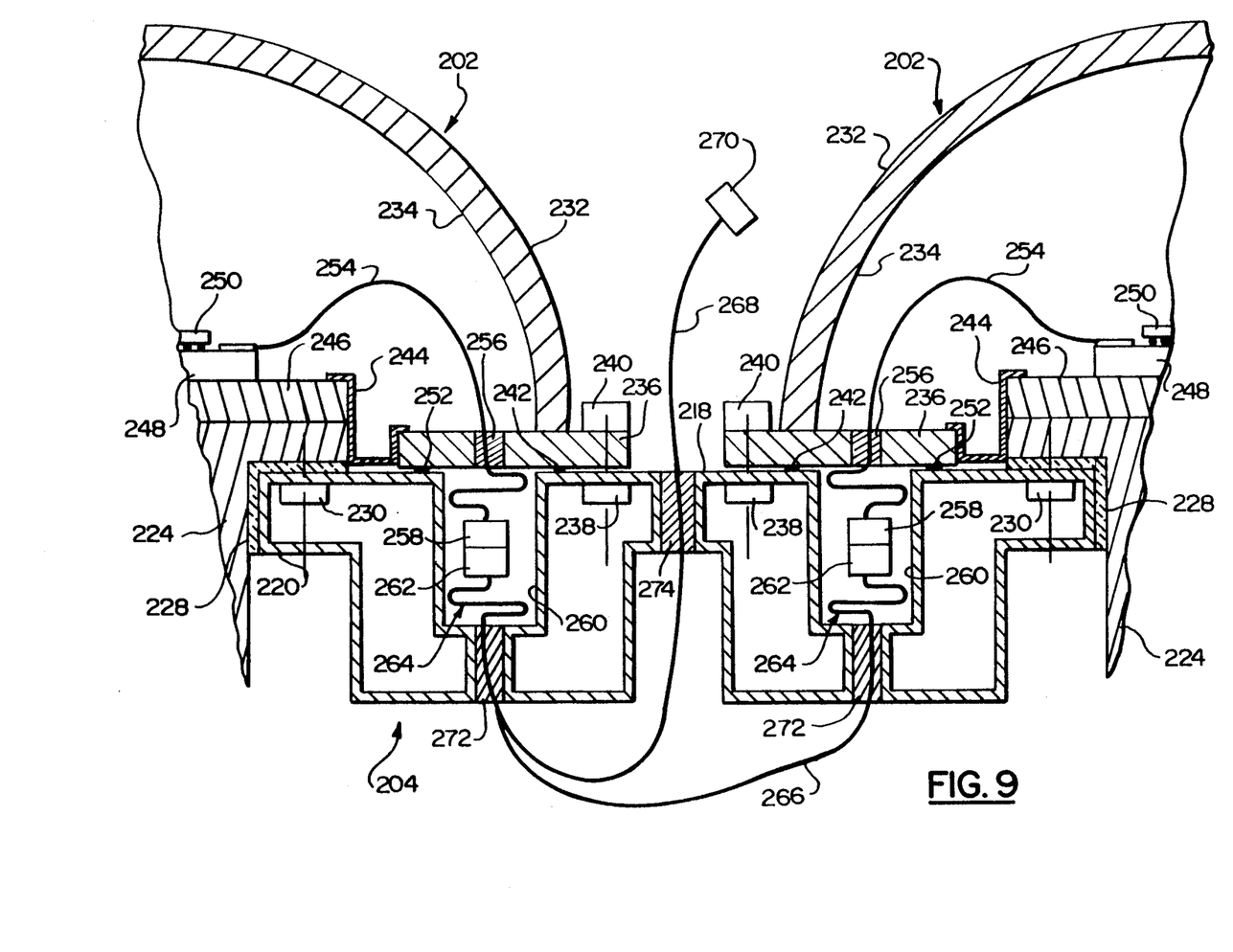
FIG. 9 is a further enlarged fragmentary section illustrating the cabling scheme of the apparatus shown in FIGS. 7 and 8.

FIG. 9 shows a possible cabling scheme for the logic units 202 shown in FIG. 8. In the modification shown in FIG. 9, an electrical cable 254 extending from chip carrier 248 passes through a hermetic seal 256 carried by flange 236 to receive a connector 258. Connector 258 is located in a well 260 formed in outer wall 218 of cryostat 204. Depending on the number of cables 254 and seals 256, well 260 may comprise either a cylindrical recess or a channel extending circumferentially around the axis of cryostat cold head 224. Connector 258 mates with a connector 262 coupled to a cable group 264. Cable group 264 passes downwardly through a hermetic seal 272 extending between the bottom wall of well 260 and inner wall 220 of cryostat 204. Cable group 264 may comprise a first cable (or group of cables) 266 which extend upwardly through an adjacent seal 272 for connection to the chip carrier 248 of the corresponding logic unit 202. In addition, cable group 264 may comprise one or more cables 268 which pass upwardly through a hermetic seal 274, extending between inner and outer walls 220 and 218 between adjacent logic units 202, to receive a connector 270 to provide an external electrical connection.

Cable group 264 comprising cables 266 and 268 and the corresponding connectors are associated with cryostat 204, while cables 254 are associated with the corresponding logic units 202. When logic units 202 are mounted on the cryostat 204, they are first connected electrically by inserting their connectors 258 into the corresponding well 260 and coupling them to connectors 262. After the necessary electrical connections have been made, the logic unit 202 is secured to cryostat 204 using bolts 240. Cable 254 is provided with a sufficient amount of slack between seal 256 and connector 258 to permit this to be done. Preferably, to isolate wells 260 both from the external environment and from the interior of cryostat 204, a second O-ring seal 252 is disposed coaxially inside of seal 242, between the mating surfaces of flange 236 and outer wall 218, radially inwardly of well 260.

While the invention has been particularly shown and described with reference to preferred embodiments, it will be understood by those skilled in the art that various changes in form and details may be made therein without departing from the spirit and scope of the invention.

What is claimed is:

1. A cryocooled logic unit used with an eternal cryogenic cold head comprising a thermally conductive enclosure portion disposed in thermal contact with said external cold head, a thermally insulating enclosure portion cooperating with said conductive portion to form an enclosure able to be removably mounted on said external cold head, and a semiconductor logic circuit mounted in said enclosure.

2. The logic unit of claim 1 in which said logic circuit is mounted in thermal contact on said conductive portion.

3. The logic unit of claim 1 in which said enclosure is formed with a recess that is adapted to receive said head.

4. The logic unit of claim 3 in which said recess is cylindrical.

5. The logic unit of claim 1 comprising means for further detachably securing said enclosure to said head.

6. The logic unit of claim 1 comprising means for further urging said conductive portion into engagement with said head.

7. The logic unit of claim 3 wherein said recess is formed of a resilient material.

8. The logic unit of claim 1 in which the interior of said enclosure is evacuated.

9. The logic unit of claim 1 in which said thermally insulating portion comprises an outer wall and an inner wall spaced inwardly from said outer wall.

10. The logic unit of claim 9 in which the region between said inner and outer walls is evacuated.

11. The logic unit of claim 1 in which said cold head is a cryocooler cold head.

12. The logic unit of claim 1 in which said logic unit is adapted to immerse said logic circuit in a pool of cryogenic liquid.

13. The logic unit of claim 12 further comprising means for supplying the interior of said enclosure with a liquifiable gas, said gas liquefying to form said pool of liquid upon contact with said thermally conductive portion.

14. The logic unit of claim 12 including means for limiting the pressure differential between the interior of said enclosure and the ambient atmosphere.

15. The logic unit of claim 12 including means for supporting a plurality of logic circuit circuits in said pool.

16. A cryocooled logic system comprising a plurality of cryogenic cold heads, a thermally conductive enclosure portion disposed in thermal contact with one of said cold heads, a thermally insulated enclosure portion cooperating with said conductive portion to form an enclosure, and a semiconductor logic circuit mounted in said enclosure, said enclosure adapted to be detachably mounted on said one of said cold heads with said conductive enclosure portion in thermal contact therewith.

17. The logic unit of claim 11 comprising means for further sealing the interface between said logic unit and said one of said cold heads.

18. The system of claim 11 including a cryostat adapted to contain a pool of cryogenically chilled liquid, said cold heads being immersed in said liquid.

19. A cryocooling system comprising: a cryostat adapted to contain a pool of cryogenically chilled liquid; a plurality of adjacently disposed cold heads having portions extending into said cryogenically cooled liquid; and a plurality of detachably mounted logic unit enclosures, each of said logic unit enclosures having a plurality of logic circuits disposed near a thermally conductive portion, a respective said thermally conductive portion arranged to be in thermal contact with one of said cold heads when a respective said logic unit is mounted.

* * * * *